United States Patent
Bai et al.

(10) Patent No.: US 10,509,277 B2
(45) Date of Patent: Dec. 17, 2019

(54) LIQUID CRYSTAL DISPLAY DEVICE

(71) Applicant: Wuhan China Star Optoelectronics Technology Co., Ltd., Wuhan, Hubei (CN)

(72) Inventors: Yujie Bai, Hubei (CN); Chun-hung Huang, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 15/996,421

(22) Filed: Jun. 1, 2018

(65) Prior Publication Data

US 2019/0204651 A1 Jul. 4, 2019

Related U.S. Application Data

(63) Continuation of application No. PCT/CN2018/073049, filed on Jan. 17, 2018.

(30) Foreign Application Priority Data

Dec. 29, 2017 (CN) .......................... 2017 1 1483946

(51) Int. Cl.
*G02F 1/1345* (2006.01)
(52) U.S. Cl.
CPC ................. *G02F 1/13452* (2013.01)
(58) Field of Classification Search
CPC ............... G02F 1/1345; G02F 1/13452; G02F 2001/13456
See application file for complete search history.

(56) References Cited

U.S. PATENT DOCUMENTS

| | | | | |
|---|---|---|---|---|
| 5,959,709 | A | * | 9/1999 | Asada ................. G02F 1/13452 349/150 |
| 2009/0237588 | A1 | | 9/2009 | Takenaka et al. |
| 2016/0363715 | A1 | * | 12/2016 | Ha ........................ G02B 6/0036 |
| 2017/0309644 | A1 | * | 10/2017 | Yeh ......................... H01L 27/124 |
| 2018/0024395 | A1 | * | 1/2018 | Mitani .............. G02F 1/133305 349/150 |

FOREIGN PATENT DOCUMENTS

| CN | 106814484 | 6/2017 |
|---|---|---|
| CN | 107193166 | 9/2017 |
| CN | 107238964 | 10/2017 |
| CN | 206541098 | 10/2017 |

* cited by examiner

*Primary Examiner* — Alexander P Gross
(74) *Attorney, Agent, or Firm* — Hemisphere Law, PLLC; Zhigang Ma

(57) ABSTRACT

The present invention provides a LCD device, comprising: a backlight module, comprising a light emitting surface and an opposite back surface; a liquid crystal panel, on the light emitting surface, wherein a signal binding end is disposed on a front surface, away from the backlight module, of the liquid crystal panel; and a COF, comprising a flexible circuit board, and a binding part and a driver chip on a first surface of the flexible circuit board, wherein the flexible circuit board is connected to the signal binding end through the binding part and is bent extendedly to the back surface of the backlight module; and in the region of the flexible circuit board at the back surface of the backlight module, the first surface of the flexible circuit board comprises a first area facing away from the backlight module, and the driver chip is connected to the first area.

8 Claims, 2 Drawing Sheets

LIQUID CRYSTAL DISPLAY DEVICE

RELATED APPLICATIONS

This application is a continuation application of PCT Patent Application No. PCT/CN2018/073049, filed Jan. 17, 2018, which claims the priority benefit of Chinese Patent Application No. 201711483946.8, filed Dec. 29, 2017, which is herein incorporated by reference in its entirety.

FIELD OF THE DISCLOSURE

The invention relates to a display technical filed, especially to a liquid crystal display device.

BACKGROUND

In many types of flat panel display devices, Liquid Crystal Display (LCD) has features of small size, low power consumption, and low manufacturing costs, zero radiation, etc., and thus currently occupies leading position in the flat panel display market.

COF (Chip on Film) is a type of driving unit used in LCD. It is usually bonded to the edge of a liquid crystal panel by a means of hot pressing. As display technology continues to evolve, narrow bezel display products have attracted a large number of consumers because of their better visual experience. In order to obtain a narrow bezel liquid crystal display device, it is usually necessary to bend the COF from the lateral side of the LCD panel to the back of the backlight module to reduce the space of the side frame occupied by the COF.

In the conventional technology, after the chip on the backside of the backlight module is bent, the driver chip is on the side of the COF closer to the backlight module. During the operation of the LCD device, the driver chip itself generates more heat radiation, and the backlight module also generates a large amount of heat radiation. Since the driver chip faces toward the backlight module, the distance between the two is small, and accumulation of the thermal radiation generated by the backlight module and the driver chip to cause the temperature of the driver chip to be too high. Driver chip is an important part of the signal transmission and processing, and the temperature being too high usually affects the stability of work performance, results in reduced reliability of the driver chip, and even leads to damage on the driver chip due to overheating, SUMMARY In view of the above issues, the present invention provides a LCD device that can reduce influences of the thermal radiation generated by the backlight module on the driver chip so as to enhance reliability of the driver chip.

To achieve the purposes, an objective of the present invention is to provide a liquid crystal display (LCD) device, comprising: a backlight module, comprising a light emitting surface and a back surface opposite to the light emitting surface; a liquid crystal panel, disposed on the light emitting surface of the backlight module, wherein a signal binding end is disposed on a front surface, away from the backlight module, of the liquid crystal panel; and a chip on film (COF), comprising a flexible circuit board, and a binding part and a driver chip disposed on a first surface of the flexible circuit board, wherein the flexible circuit board is connected to the signal binding end through the binding part and is bent extendedly to the back surface of the backlight module; wherein in the region of the flexible circuit board extendedly bending at the back surface of the backlight module, the first surface of the flexible circuit board comprises a first area facing away from the backlight module, and the driver chip is connected to the first area.

Wherein the COF comprises a flexible circuit board, and the binding part comprises a first binding part and a second binding part; the first binding part is disposed on a first end of the flexible circuit board in order to electrically connect the flexible circuit board to the signal binding end, the second binding part is disposed on a second end of the flexible circuit board in order to electrically connect the flexible circuit board to a printed circuit board, and the driver chip is disposed between the first binding part and the second binding part on a signal transmission pathway.

Wherein two or more bending portions are disposed between the first end and the second end of the flexible circuit board; and the two or more bending portions allow the flexible circuit board to bend and extend in an S shape to the back surface of the backlight module.

Wherein a first bending portion and a second bending portion are disposed between the first end and the second end of the flexible circuit board, and the first area is defined as an area between the second bending portion and the second end of the first surface and faces away from the backlight module.

Wherein the first binding part is connected to the signal binding end through a first anisotropic conductive film, and the second binding part is connected to the printed circuit board through a second anisotropic conductive film.

Wherein the COF comprises a plurality of sequentially connected flexible circuit boards; first surfaces of two of the connected adjacent flexible circuit boards are oriented oppositely, at least one of the flexible circuit board is arranged at the back surface of the backlight module and a first surface of the at least one of the flexible circuit board faces away from the backlight module to form the first area.

Wherein the COF comprises a first flexible circuit board and an interconnected second flexible circuit board, and the binding part comprising a first binding part, a second binding part, a third binding part and a fourth binding part; the first binding part is disposed on a first end of the first flexible circuit board to electrically connect the first flexible circuit board to the signal binding end; the second binding part is disposed on a second end of the first flexible circuit board to electrically connect the first flexible circuit board to the second flexible circuit board; the third binding part is disposed on a first end of the second flexible circuit board to electrically connect the second flexible circuit board to the first flexible circuit board; the fourth binding part is disposed on a second end of the second flexible circuit board to electrically connect the second flexible circuit board to a printed circuit board; and a first surface of the second flexible circuit board faces away from the backlight module, and the driver chip is disposed on a first surface of the second flexible circuit board.

Wherein a first bending portion is disposed between the first end and the second end of the first flexible circuit board, the first bending portion allows the second end of the first flexible circuit board extending to the back surface 1b of the backlight, and the second flexible circuit board is flatly connected to the second end of the first flexible circuit board.

Wherein the first binding part is connected to the signal binding end through a first anisotropic conductive film, the second binding part is interconnected with the third binding part through a second anisotropic conductive film, and the printed circuit board is connected to the fourth binding part through a third anisotropic conductive film.

Wherein the COF comprises a gate-COF for signal scanning and a source-COF for data signal providing.

As the LCD device provided in the embodiment of the present invention, the COF is bent extend to the back surface of the backlight module, and the driver chip is on the COF facing away from the backlight module. Thus the distance of the driver chip and the backlight module is increased, and under a condition that beneficial to the design of the narrow bezel, the issue of bad work performance due to overheating the driver chip can also be avoided, Reliability of the driver chip is therefore increased.

DETAILED DESCRIPTION OF PREFERRED EMBODIMENTS

In order to more clearly illustrate the technical solutions and purposes of the present application, the embodiments of the present invention are described in detail below in accompany with drawings or figures. The preferred embodiments are illustrated in the figures for the purpose of illustration. The figures are drawn according to the embodiments of the present invention and are for exemplification only, but not intending to limit the present invention in to certain embodiments.

Herein, it is noted that only structures and/or processing steps closely related to the invention are shown in the figures, while other details are omitted, to avoid ambiguity by unnecessary details.

Embodiment 1

Figure 1:
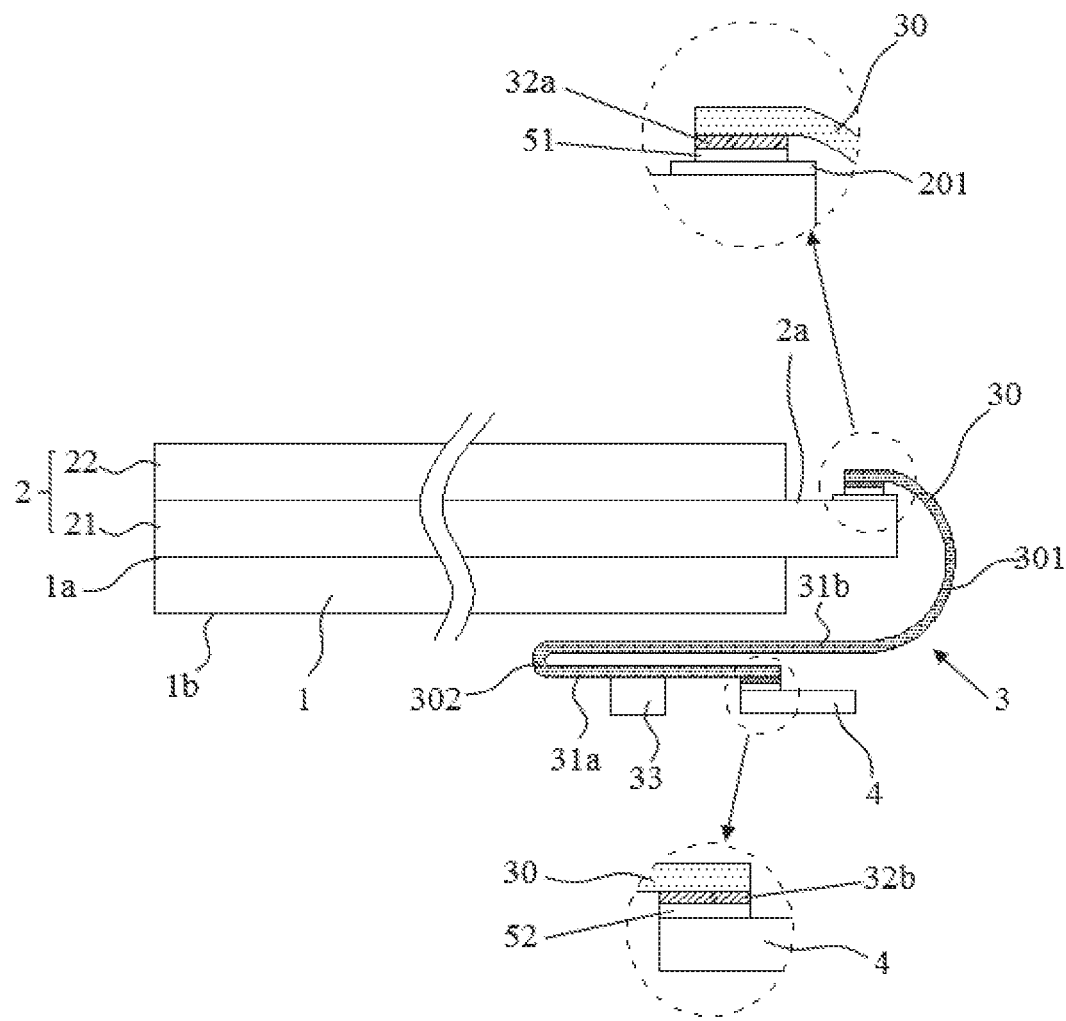
FIG. 1 is a structural schematic according to the LCD device of the present embodiment 1.

The present invention provides a liquid crystal display (LCD) device as shown in FIG. 1, the LCD device includes a backlight module 1, liquid crystal panel 2, a chip on film (COF) 3, and a printed circuit board 4. Wherein the backlight module 1 and the liquid crystal panel 2 are disposed opposite to each other; the backlight module 1 includes a light emitting surface 1a and a back surface 1b opposite to the light emitting surface 1a; the liquid crystal panel 2 is disposed on the light emitting surface 1a of the backlight module 1; and a signal binding end 201 is disposed on a front surface 2a of the liquid crystal panel 2 away from the backlight module 1. Specifically, the liquid crystal panel 2 includes a thin film transistor (TFT) array substrate 21 and a color filter substrate 22, which are disposed oppositely to each other. The signal binding end 201 is disposed on an edge of the TFT array substrate 21.

Figure 2:
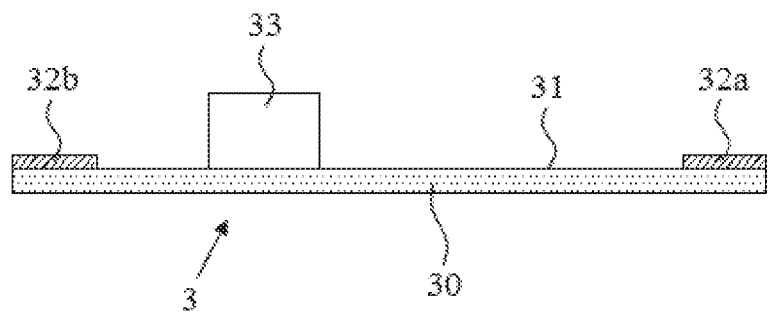
FIG. 2 is a structural schematic according to the COF of the present embodiment 1.

In the embodiment, as shown in FIG. 1 and FIG. 2, the COF 3 includes a flexible circuit board 30, a binding part 32a and 32b, and a driver chip 33, wherein the binding part 32a and 32b and the driver chip 33 are disposed on a first surface 31 of the flexible circuit board 30. The flexible circuit board 30 electrically connects to the signal binding end 201 and the printed circuit board 4 through the binding part 32a and 32b, and the flexible circuit board 30 is bent to extend to the back surface 1b of the backlight module 1. Further, in which a part of the flexible circuit board 30 extendedly bending to the back surface 1 of the backlight module 1, the first surface 31 of the flexible circuit board 30 includes a first area 31 faces away from the backlight module 1, and the driver chip 33 is connected to the first area 31a. The driver chip 33 is protruded from the first surface 31 in a direction away from the back surface 1b of the backlight 1, and therefore to increase the distance between the driver chip 33 and the backlight module 1 so as to decrease influence of the heat generated by the backlight module 1 to the driver chip 33.

In this embodiment, as shown in FIG. 1 and FIG. 2, the COF 3 includes the flexible circuit board 30, a first binding part 32a and a second binding part 32b are disposed on the flexible circuit board 30, and the first binding part 32a, the second binding part 32b, and the driver chip 33 are all disposed on the first surface 31 of the flexible circuit board 30. That is, the first binding part 32a, the second binding part 32b and the driver chip 33 are disposed at the same side of the COF 3. Specifically, the first binding part 32a is disposed on a first end of the flexible circuit board 30 in order to electrically connect the flexible circuit board 30 to the signal binding end 201; the second binding part 32b is disposed on a second end of the flexible circuit board 30 in order to electrically connect the flexible circuit board 30 to the printed circuit board 4; and the driver chip 33 is disposed between the first binding part 32a and the second binding part 32b on a signal transmission pathway. Specifically, the first binding part 32a is connected to the signal binding end 201 through a first anisotropic conductive film 51, and the second binding part 32b is connected to the printed circuit board 4 through a second anisotropic conductive film 52.

Wherein as shown in FIG. 1, there are a first bending portion 301 and a second bending portion 302 disposed between the first end and the second end of the flexible circuit board 30. The first bending portion 301 and the second bending portion 302 together allow the flexible circuit board 30 to bend and extend in an S shape to the back surface 1b of the backlight 1. Wherein an area of the first surface 31 between the second bending portion 302 and the second end facing away from (or backing to) the backlight module 1 forms (is defined as) the first area 31a, and an area of the first surface 31 between the first bending portion 301 and the second bending portion 302 end forms (is defined as) a second area 31b, which faces to the backlight module 1. The driver chip 33 is connected to the first area 31a, and the driver chip 33 is toward a direction away from the back surface 1b of the backlight module 1. In addition, it can be seen from FIG. 1 that the driver chip 33 and the backlight module 1 are separated by the two areas of the flexible circuit board 30 because the flexible circuit board 30 is folded back and forth, and thus the heat radiation generated by the backlight module 1 can be better prevented from being exposed onto the driver chip 33.

It should be noted that, in other embodiments, there can be more bending portions between the first end and the second end of the flexible circuit board 30 to allow the flexible circuit board 30 to extend in an S shape as well. Compared with the above embodiment having only two bending portions, providing a greater number of bending portions merely increases the number of times of folding back and forth of the flexible circuit board 30. In this case, the first surface 31 includes many areas that back to (face away from) the backlight module 1, and the driver chip 33 can be connected to anyone of the plurality of areas.

Additionally, in the LCD device, the COF 3 includes a gate-COF for signal scanning and a source-COF for signal providing. The gate-COF and the source-COF can be both applied in the above illustrated arrangement to prevent influences of the thermal generated by the backlight module from the driver chip.

As the LCD device provided in the embodiment above, the COF is bent and extended to the back surface of the backlight module, and two or more bending portions are arranged to make the driver chip protruded on the COF away from the backlight module so as to increase the distance between the driver chip and the backlight module and thus decrease the influence of the heat generated by the backlight module to the driver chip. The arrangement/structure is beneficial to the design of the narrow bezel and also avoids the issue of bad work performance due to overheating the driver chip. Reliability of the driver chip is therefore increased.

Embodiment 2

The embodiment provides a LCD device, but has a different COF structure from that of the embodiment 1.

Figure 3:
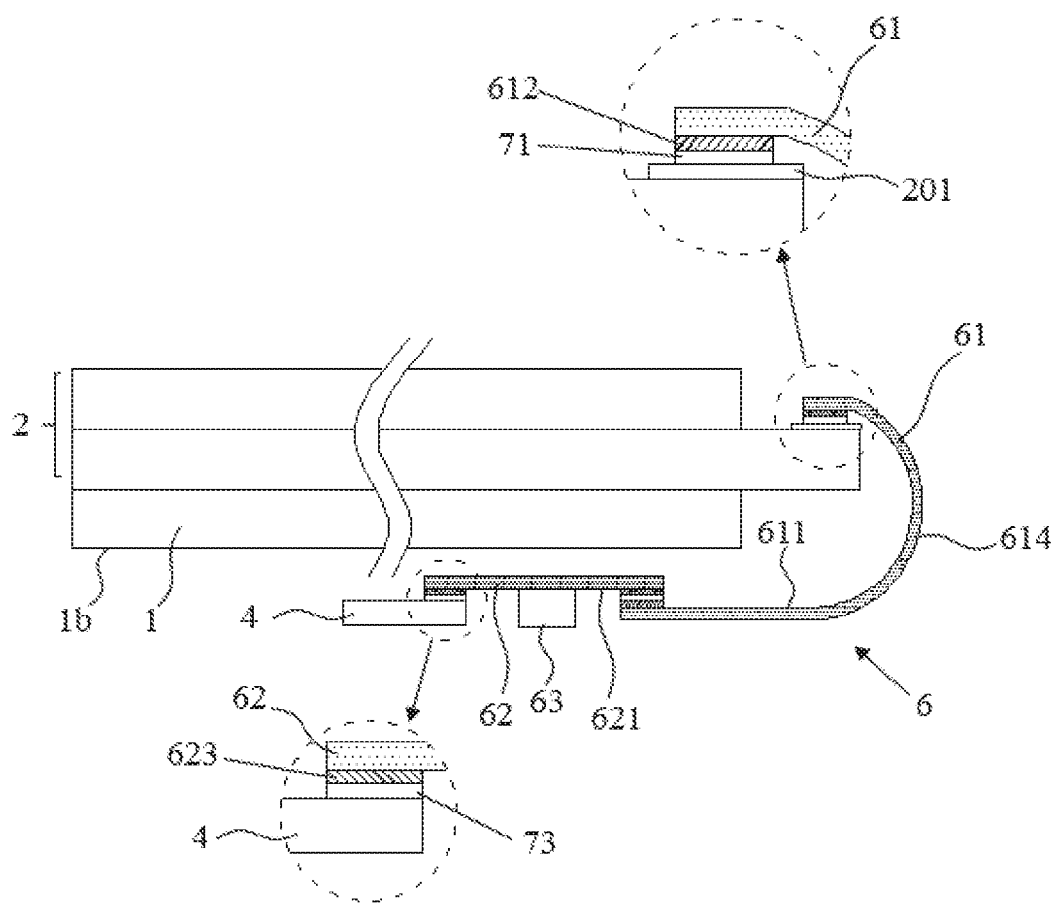
FIG. 3 is a structural schematic according to the LCD device of the present embodiment 2.
Figure 4:
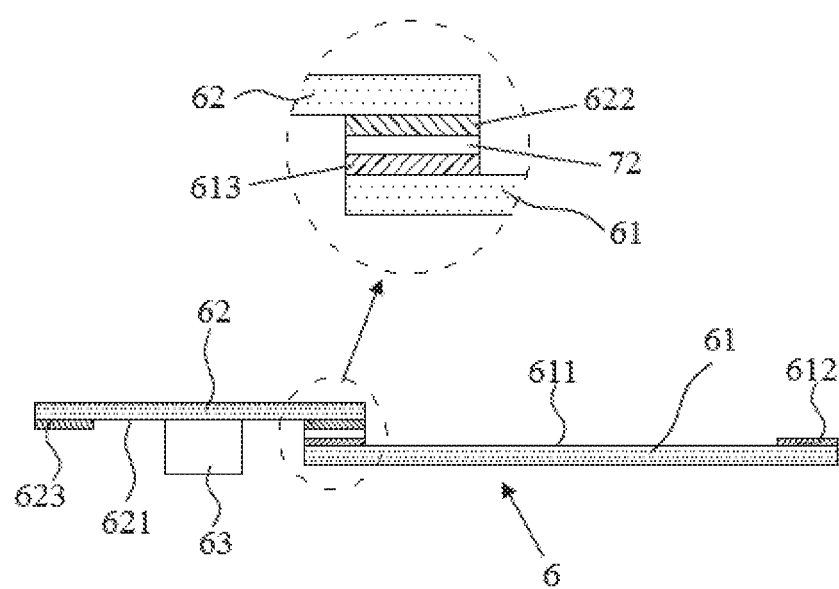
FIG. 4 is a structural schematic according to the COF of the present embodiment 2.

Specifically, as shown in FIG. 3 and FIG. 4, in this embodiment, a COF 6 includes a first flexible circuit board 61 and an interconnected second flexible circuit board 62. A first binding part 612 and a second binding part 613 are disposed on a first surface 611 of the first flexible circuit board 61, and a third binding part 622, a fourth binding part 623, and a driver chip 63 are disposed on a first surface 621 of second first flexible circuit board 62.

Wherein the first binding part 612 is disposed on a first end of the first flexible circuit board 61 in order to electrically connect the first flexible circuit board 61 to the signal binding end 201 of the liquid crystal panel 2; the second binding part 613 is disposed on a second end of the first flexible circuit board 61 in order to electrically connect the first flexible circuit board 61 to the second flexible circuit board 62; the third binding part 622 is disposed on a first end of the second flexible circuit board 62 in order to electrically connect the second flexible circuit board 62 to the first flexible circuit board 61; and the fourth binding part 623 is disposed on a second end of the second flexible circuit board 62 in order to electrically connect the second flexible circuit board 62 to the printed circuit board 4.

Further, as shown in FIG. 3, the first end of the first flexible circuit board 61 is connected to the signal binding end 201, the second end is bent and extended to the back surface 1b of the backlight module 1, and a first surface 611 of the first flexible circuit board 61 faces toward the backlight module 1. The first end of the second flexible circuit board 62 is connected to the second end of the first flexible circuit board 61, and a first surface 621 of the second flexible circuit board 62 and the first surface 611 of the first flexible circuit board 61 are toward to opposite orientations/directions. That is, the first surface 621 of the second flexible circuit board 62 faces away from the backlight module 1, and the driver chip 63 is disposed on the first surface 621 of the second flexible circuit board 62. Therefore, the driver chip 63 is protruded from the first surface 621 toward a direction away from the back surface 1b of the backlight module 1 so as to increase the distance between the driver chip 33 and the backlight module 1. And the influence of the heat generated by the backlight module 1 on the driver chip 63 can be decreased.

Specifically, as shown in FIG. 3, a first bending portion 614 is disposed between the first end and the second end of the first flexible circuit board 61, the first bending portion 614 allows the second end of the first flexible circuit board 61 extending to the back surface 1b of the backlight 1, and the second flexible circuit board 62 is flatly connected to the second end of the first flexible circuit board 61.

Specifically, as shown in FIG. 3, the first binding part 612 is connected to the signal binding end 201 through a first anisotropic conductive film 71, the second binding part 613 is interconnected with the third binding part 622 through a second anisotropic conductive film 72, and the fourth binding part 623 is connected to the printed circuit board 4 through a third anisotropic conductive film 73.

Further, in other embodiments, the COF 6 further includes a larger number of flexible circuit boards. Specifically, with reference to the connection/arrangement of the first flexible circuit board 61 and the second flexible circuit board 62, a plurality of flexible circuit boards are sequentially connected on the second end of the second flexible circuit board 62, and the first surfaces of the two connected adjacent flexible circuit boards are oriented oppositely. It is easy to understand that in those sequentially connected flexible circuit boards, some of the flexible circuit boards are similar to the first flexible circuit boards 61 having the first surface facing toward the backlight module 1; and the rest of the flexible circuit boards are similar to the second flexible circuit boards 62 having the first surface facing away from the backlight module 1. In the case, the driver chip 63 can connect to either the second flexible circuit board 62 or any flexible circuit board having a first surface facing away from the backlight module 1. Wherein the printed circuit board 4 is connected to the terminal end of the flexible circuit board.

As the LCD device provided in the embodiment above, the COF is bent and extended to the back surface of the backlight module, and the COF includes two or more sequentially connected flexible circuit boards, wherein at least one flexible circuit board is arranged at the back surface of the backlight module, and its first surface faces away from the backlight module. The driver chip in this case is connected to the at least one flexible circuit board, and so the driver chip is on the COF facing away from the backlight module. Thus the distance of the driver chip and the backlight module is increased, and under a condition that beneficial to the design of the narrow bezel, the issue of bad work performance due to overheating the driver chip can also be avoided. Reliability of the driver chip is therefore increased.

It is noted that, in the disclosure, relational terms such as first and second and the likes only used to distinguish one entity or operation from another without necessarily requiring or implying these entities or operations in the presences of actual relationship or order between them. Further, the term "comprising", "containing" or any other variation thereof are intended to cover a non-exclusive inclusion, such that a process, method, article, article, or apparatus not include only those elements but not expressly listed further comprising the other elements, or further comprising such process, method, article, or apparatus inherent elements. Without more constraints, by the wording "include a" defined does not exclude the existence of additional identical elements in the element comprising a process, method, article, or apparatus.

The above embodiments of the present invention are illustrative only, and any modifications or perfections of the invention by an ordinary skilled person in the art, without departing from the spirit of the present invention, are still within the scope of protection of the present application.

What is claimed is:

1. A liquid crystal display (LCD) device, comprising:
a backlight module, comprising a light emitting surface and a back surface opposite to the light emitting surface;
a liquid crystal panel, disposed on the light emitting surface of the backlight module, wherein a signal binding end is disposed on a front surface, away from the backlight module, of the liquid crystal panel; and
a chip on film (COF), comprising a flexible circuit board, a binding part and a driver chip disposed on a first surface of the flexible circuit board, wherein the flexible circuit board is connected to the signal binding end through the binding part and is bent and extended to the back surface of the backlight module;
wherein the first surface of the flexible circuit board extendedly bending to the back surface of the backlight module comprises a first area facing away from the backlight module, and the driver chip is connected to the first area;
wherein the flexible circuit board comprises two or more bending portions stacked between the backlight module and the driver chip in a vertical direction, the two or more bending portions are bended and extended toward the first area.

2. The LCD device according to claim 1, wherein the COF comprises a flexible circuit board, and the binding part comprises a first binding part and a second binding part; wherein
the first binding part is disposed on a first end of the flexible circuit board in order to electrically connect the flexible circuit board to the signal binding end,
the second binding part is disposed on a second end of the flexible circuit board in order to electrically connect the flexible circuit board to a printed circuit board; and
the driver chip is disposed between the first binding part and the second binding part on a signal transmission pathway.

3. The LCD device according to claim 2, wherein the two or more bending portions allow the flexible circuit board to bend and extend in an S shape to the back surface of the backlight module.

4. The LCD device according to claim 3, wherein a first bending portion and a second bending portion are disposed between the first end and the second end of the flexible circuit board, and the first area is defined as an area between the second bending portion and the second end of the first surface and faces away from the backlight module.

5. The LCD device according to claim 2, wherein the first binding part is connected to the signal binding end through a first anisotropic conductive film.

6. The LCD device according to claim 5, wherein the printed circuit board is connected to the second binding part through a second anisotropic conductive film.

7. The LCD device according to claim 2, wherein the COF comprises a gate-COF for signal scanning and a source-COF for data signal providing.

8. The LCD device according to claim 2, wherein the liquid crystal panel comprises a thin film transistor (TFT) array substrate and a color filter substrate arranged oppositely, and the signal binding end is disposed on an edge of the TFT array substrate.

* * * * *